United States Patent
Wen

[19]

[11] Patent Number: 5,943,573
[45] Date of Patent: Aug. 24, 1999

[54] METHOD OF FABRICATING SEMICONDUCTOR READ-ONLY MEMORY DEVICE

[75] Inventor: Jemmy Wen, Hsinchu, Taiwan

[73] Assignee: United Microelectronics Corp., Taiwan

[21] Appl. No.: 08/838,135

[22] Filed: Apr. 15, 1997

[30] Foreign Application Priority Data

Jan. 17, 1997 [TW] Taiwan ................................. 86100495

[51] Int. Cl.$^6$ .............................................. H01L 21/8246
[52] U.S. Cl. ........................................... 438/275; 438/278
[58] Field of Search ................................... 438/275–278, 438/288

[56] References Cited

U.S. PATENT DOCUMENTS 3,914,855 10/1975 Cheney et al. .
4,356,042 10/1982 Gedaly et al. .
4,898,840 2/1990 Okuyama .

*Primary Examiner*—Jey Tsai
*Attorney, Agent, or Firm*—Finnegan, Henderson, Farabow, Garrett & Dunner, L.L.P.

[57] ABSTRACT

A ROM (read-only memory) device of the type including an array of MOSFET (metal-oxide semiconductor field-effect transistor) memory cells and a method for fabricating the same are provided. The method allows for better planarization of the wafer surface of the ROM device with increased gap fill capability. Further, the bit lines are formed by forming a substantially grid-like structure including a plurality of substantially parallel-spaced first portions oriented in a first direction and a plurality of substantially parallel-spaced second portions oriented in a second direction. The first portions serve as bit lines and the second portions serve as channels. In the code-definition and implantation process, a selected number of the channel regions are diffused with impurities so as to set the associated memory cells with a first threshold voltage representing the storage of a first binary digit; while the threshold voltage of all the other channel regions that are not diffused with impurities are set to a second threshold voltage representing the storage of a second binary digit. In the method of fabricating the ROM device, the bit lines are not formed by diffusing impurities into the silicon substrate. As a result of this, the drawbacks of lateral diffusion, junction leakage, and reduced breakdown voltage are not experienced when the ROM device is further miniaturized.

15 Claims, 8 Drawing Sheets

METHOD OF FABRICATING SEMICONDUCTOR READ-ONLY MEMORY DEVICE

BACKGROUND OF THE INVENTION

1. Field of the Invention

This invention relates to semiconductor memory devices, and more particularly, to a ROM (read-only memory) device of the type including an array of MOSFET (metal-oxide semiconductor field-effect transistor) memory cells for data storage and a method of fabricating the same.

2. Description of Related Art

Read-only memory (ROM) is a nonvolatile semiconductor memory widely used in computer and microprocessor systems for permanently storing information including programs and data that are repeatedly used, such as the BIOS (abbreviation for Basic Input/Output System, a widely used operating system on personal computers) or the like. The manufacture of ROMs involves very complicated and time-consuming processes and requires costly equipment and material to achieve. Therefore, the data to be permanently stored in ROMs is usually first defined by the customer and then furnished to the factory to be programmed into the ROMs.

Most ROMs are identical in semiconductor structure except for the different data stored therein. Therefore, the ROM devices can be fabricated up to the stage ready for the programming and then the semi-finished products are stocked in inventory awaiting customer orders. The customer then furnishes the data to the factory where the data are permanently written into the semi-finished ROMs by using the so-called mask programming process. This procedure is now a standard method in the semiconductor industry for fabricating ROMs.

In most ROMs, metal-oxide semiconductor field-effect transistors (MOSFET) are used as the memory cells for storing data. In the mask programming stage, impurities are selectively diffused into specific channels in the MOSFET memory cells so as to change the threshold voltage thereof thereby setting the MOSFET memory cells to ON/OFF states representing different binary data. The MOSFET memory cells are connected to the external circuits via a plurality of polysilicon-based word lines and bit lines. The channel regions are located beneath the word lines and between each pair of adjacent bit lines. Whether one MOSFET memory cell is set to store a binary digit of 0 or 1 is dependent on whether the associated channel is diffused with impurities or not. If the associated channel is diffused with impurities, the MOSFET memory cell is set to have a high threshold voltage, effectively setting the MOSFET memory cell to a permanently-OFF state representing the storage of a first binary digit, for example 1; otherwise, the MOSFET memory cell is set to have a low threshold voltage, effectively setting the MOSFET memory cell to a permanently-ON state representing the storage of a second binary digit, for example 0.

FIG. 1 shows the circuit diagram of a conventional mask ROM device 10 which includes a plurality of crosswise-arranged parallel-spaced word lines [WL0, WL1, WL2, WL3] and a plurality of lengthwise-arranged parallel-spaced bit lines [BL0, BL1, BL2, BL3, BL4]. Each segment of the word lines located between one neighboring pair of the bit lines is the location where one MOSFET memory cell is formed. The binary data stored in each MOSFET memory cell is dependent on the threshold voltage of the same. For instance, if one MOSFET memory cell is custom-made with a high threshold voltage, it means that this MOSFET memory cell is set to a permanently-OFF state representing the permanent storage of a first binary digit, for example 1. On the other hand, if the MOSFET memory cell is custom-made with a low threshold voltage, it means that this MOSFET memory cell is set to a permanently-ON state representing the permanent storage of a second binary digit, for example 0. In FIG. 1, for example, those memory cells that are set to a permanently-OFF state are indicated by the labeling of a black box between the source/drain electrodes, as indicated by the one labeled with the reference numeral 14. Conversely, those memory cells that are not labeled with a black box are set to a permanently-ON state, as indicated by the one labeled with the reference numeral 12.

To read data from the ROM device, a specific potential is applied to the corresponding bit lines and word lines. For instance, to read data from the memory cell 12 (which has a low threshold voltage indicating the storage of the binary data of 0), a potential is applied to the gate of the memory cell 12 via the word line WL0 and the drain of the same via the bit line BL0. Since the memory cell 12 is custom-made with a low threshold voltage, the applied potential will turn ON the MOSFET memory cell, thus causing a change in the current flowing in the bit line BL0. By contrast, since the memory cell 14 is custom-made with a high threshold voltage, the applied potential will not cause a change in the current flowing in the corresponding bit line BL2. By detecting the current changes in the bit lines, the external circuitry can determine whether the data is 0 or 1.

Referring to FIG. 2, there is shown a top view of the layout of part of the conventional ROM device of FIG. 1. This ROM device is based on a P-type silicon substrate 20. Through ion implantation with an N-type impurity material at selected areas on the silicon substrate 20, a plurality of parallel-spaced buried bit lines 22, 26 and complementary bit lines 24, 28 are formed. The buried bit lines 22, 26 are connected to a voltage source V, while the complementary bit lines 24, 28 are connected to ground. The ROM device is further formed with a plurality of parallel-spaced word lines WL0, WL1 intercrossing the buried bit lines 22, 26 and complementary bit lines 24, 28 substantially at a right angle. This forms a plurality of MOSFET memory cells 30 (as indicated by the dashed boxes in FIG. 2) which have a low threshold voltage, and a plurality of MOSFET memory cells 32 which have a high threshold voltage.

Referring to FIG. 3, there is shown a schematic sectional diagram of a part of the ROM device of FIG. 2. This sectional diagram is used in particular to depict the programming of data into the ROM device. First, a silicon substrate 15 is prepared. Then, an N-type impurity material, such as arsenic (As), is diffused by means of ion implantation into selected regions of the silicon substrate 15 to form a plurality of parallel and substantially equally spaced N$^+$ diffusion regions 11 serving as a plurality of bit lines. One channel region 16 is formed between each neighboring pair of the N$^+$ diffusion regions (bit lines) 11. Subsequently, a thermal oxidation process is performed on the wafer. Due to different oxidation rates at different regions, a thick oxidation layer 17a (which serves as an isolation layer) is formed over the N$^+$ diffusion regions (bit lines) 11, while a thin oxidation layer 17b is formed over each channel region 16. After that, a plurality of parallel-spaced polysilicon layers 13 (which serve as word lines) are formed over the wafer in such a manner as to intercross the underlying N$^+$ diffusion regions (bit lines) 11 substantially at a right angle (only one of the polysilicon layers 13 is visible in the sectional diagram of FIG. 3). This completes the semi-finished product of the ROM device.

In the mask programming process, a mask 19 covers the top surface of the semi-finished product of the ROM device. This mask 19 is predefined to form a plurality of openings to expose those channel regions that are associated with the MOSFET memory cells that are to be set to a permanently-OFF state. A P-type impurity material, such as boron, is diffused by ion implantation through the openings in the mask 19 into the corresponding channel regions. This completes the so-called code implantation process.

In the finished product of the ROM device, the doped channels cause the associated MOSFET memory cells to have a high threshold voltage thus setting them to a permanently-OFF state. On the other hand, the undoped channels cause the associated MOSFET memory cells to have a low threshold voltage, thus setting them to a permanently-ON state.

The foregoing ROM device, however, has the following two drawbacks. First, when the ROM device is further miniaturized, the application of a high concentration of impurities to selected channel regions could cause the undesired phenomena of lateral diffusion, junction leakage, and reduced breakdown voltage. This is due to the fact that the buried bit lines in the conventional ROM device are formed by implanting impurities into the silicon substrate. Second, since the process for fabricating the conventional ROM device involves the use of thermal oxidation to form the isolating oxidation layers, the planarization of the wafer surface is not very satisfactory. Poor planarization adversely affects the performance of the ROM device.

SUMMARY OF THE INVENTION

It is therefore a primary objective of the present invention to provide a new semiconductor structure for a ROM device in which the above-mentioned drawbacks are substantially eliminated.

It is another objective of the present invention to provide a method for fabricating the foregoing ROM device.

In accordance with the foregoing and other objectives of the present invention, an improved semiconductor structure for a ROM device and a method for fabricating such a ROM device are provided.

The semiconductor of the ROM device includes:

a semiconductor substrate;

a first insulating layer formed over the substrate;

a plurality of substantially parallel-spaced elongated conductive layers oriented in a first direction to serve as a plurality of word lines;

a second insulating layer formed in each of the spaces between the conductive layers;

a third insulating layer formed over the conductive layers and the insulating layer;

a grid-like structure of a semiconductor layer formed over the third insulating layer, the grid-like structure having a plurality of substantially parallel-spaced first portions oriented in a second direction substantially at a right angle with respect to the first direction and a plurality of substantially parallel-spaced second portions oriented in the first direction overlaying the conductive layers;

the first portions of the grid-like structure serving as a plurality of bit lines for the ROM device and the second portions of the grid-like structure serving as a plurality of channel regions associated with the bit lines.

Alternatively, the semiconductor of the ROM device includes:

a semiconductor substrate;

a first insulating layer formed over the substrate;

a plurality of substantially parallel-spaced elongated conductive layers oriented in a first direction to serve as a plurality of word lines;

a second insulating layer formed in each of the spaces between the conductive layers;

a third insulating layer formed over the conductive layers and the insulating layer;

a plurality of substantially parallel-spaced first semiconductor layers serving as a plurality of bit lines over the third insulating layer and oriented in a second direction substantially at a right angle with respect to the first direction; and a plurality of substantially parallel-spaced second semiconductor layers serving as a plurality of channel regions between the bit lines, the second semiconductor layers being formed at positions overlaying the conductive layers.

The method of fabricating the foregoing ROM device includes the steps of:

(1) forming a semiconductor substrate having a first insulating layer thereon;

(2) forming a plurality of substantially parallel-spaced elongated conductive layers oriented in a first direction on the first insulating layer, wherein the conductive layers serve as a plurality of word lines;

(3) forming a second insulating layer formed in each of the empty spaces between the plurality of conductive layers;

(4) forming a third insulating layer formed over the conductive layers and the insulating layer;

(5) forming a semiconductor layer over the third insulating layer;

(6) removing selected portions of the semiconductor layer to form a grid-like structure of the semiconductor layer having a plurality of substantially parallel-spaced first portions oriented in a second direction substantially at a right angle with respect to the first direction and a plurality of substantially parallel-spaced second portions oriented in the first direction overlaying the conductive layers;

(7) forming a fourth insulating layer to fill up each of the empty spaces in the grid-like structure;

(8) defining the first portions of the grid-like structure as bit lines and the second portions of the grid-like structure as channel regions; and (9) performing a code-definition and implantation process to program data into the ROM device, wherein a first selected group of the channel regions are doped with an impurity material to thereby have a first threshold voltage representing the storage of a first binary digit in the associated memory cells, and a second selected group of the channel regions are not doped with the impurity material to thereby have a second threshold voltage representing the storage of a second binary digit in the associated memory cells.

The foregoing ROM device offers several benefits over the prior art. First, better planarization of the wafer surface can be achieved with increased gap fill capability. Second, since the bit lines are not formed by diffusing impurities into the silicon substrate, the drawbacks of lateral diffusion, junction leakage, and reduced breakdown voltage are not experienced when the ROM device is further miniaturized.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

FIGS. 4A through 4K are schematic diagrams depicting the steps involved in the method according to the present invention for fabricating a ROM device of the type including a plurality of MOSFET memory cells for storing data.

Figure 1:
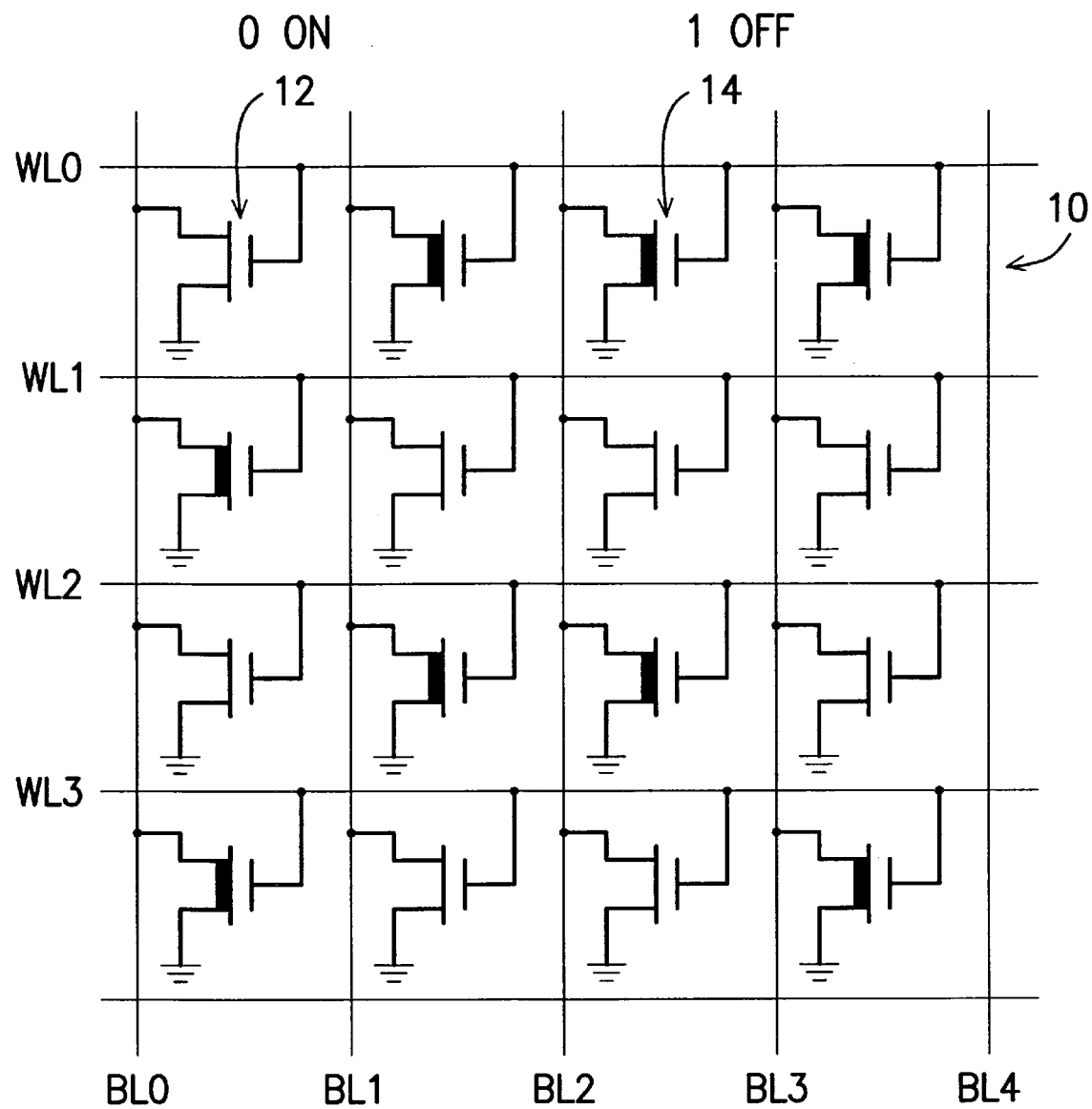
FIG. 1 is a schematic circuit diagram of a conventional ROM device.
Figure 2:
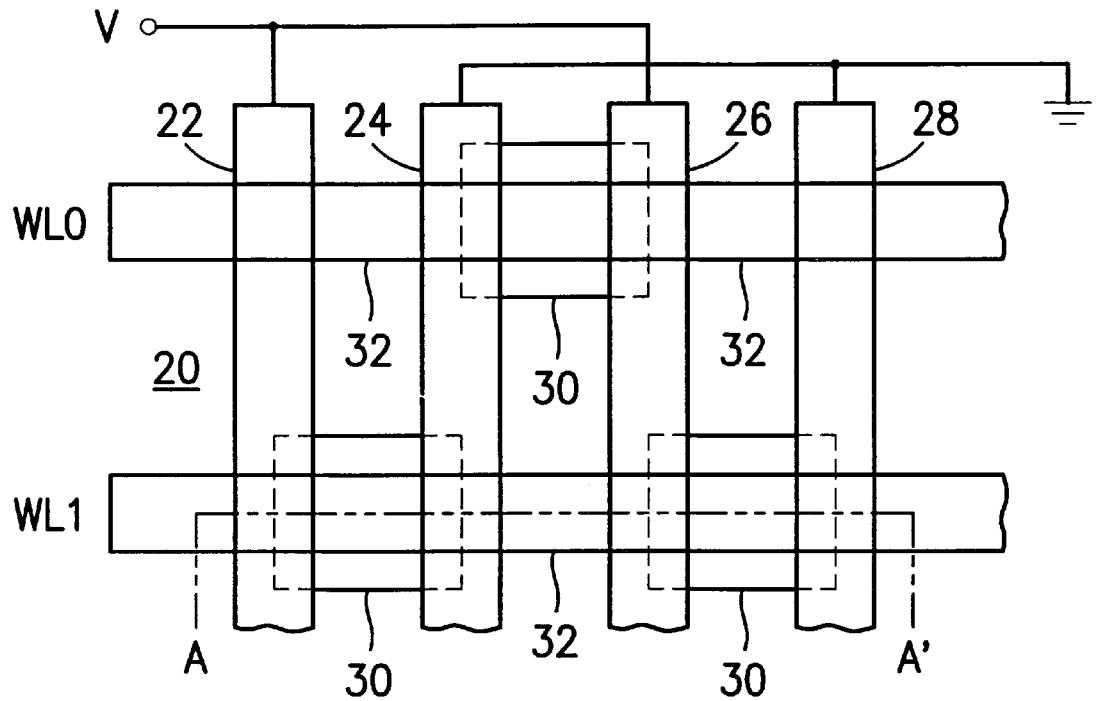
FIG. 2 is a top view of the layout of part of the ROM device of FIG. 1.
Figure 3:
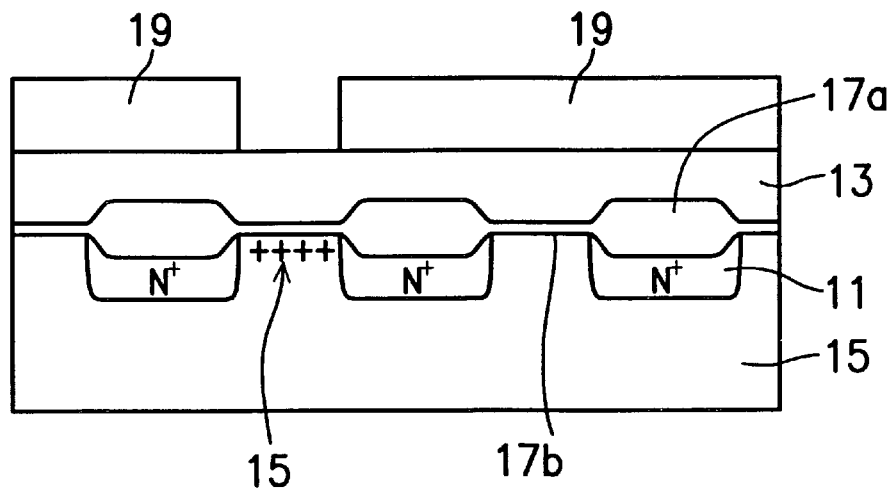
FIG. 3 is a schematic sectional diagram showing the semiconductor structure of the ROM device of FIG. 2 cutting through the line A–A'.
Figure 4A:
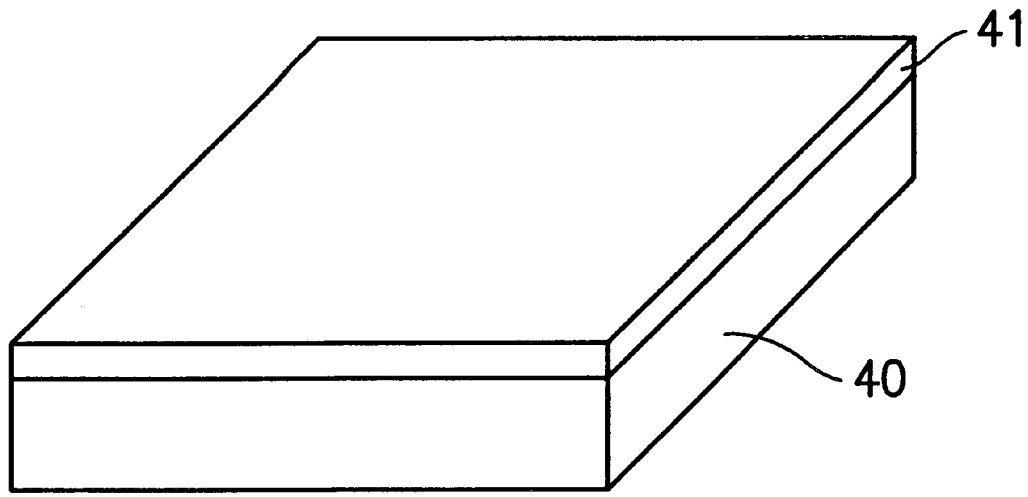
FIGS. 4A through 4K are schematic diagrams used to depict the steps involved in the method according to the present invention for fabricating a ROM device.

Referring first to FIG. 4A, in the first step, a semiconductor substrate 40 of a first type, which can be either P-type or N-type, is prepared. Subsequently, a first insulating layer 41, such as a layer of silicon oxide, is formed over the substrate 40.

Figure 4B:
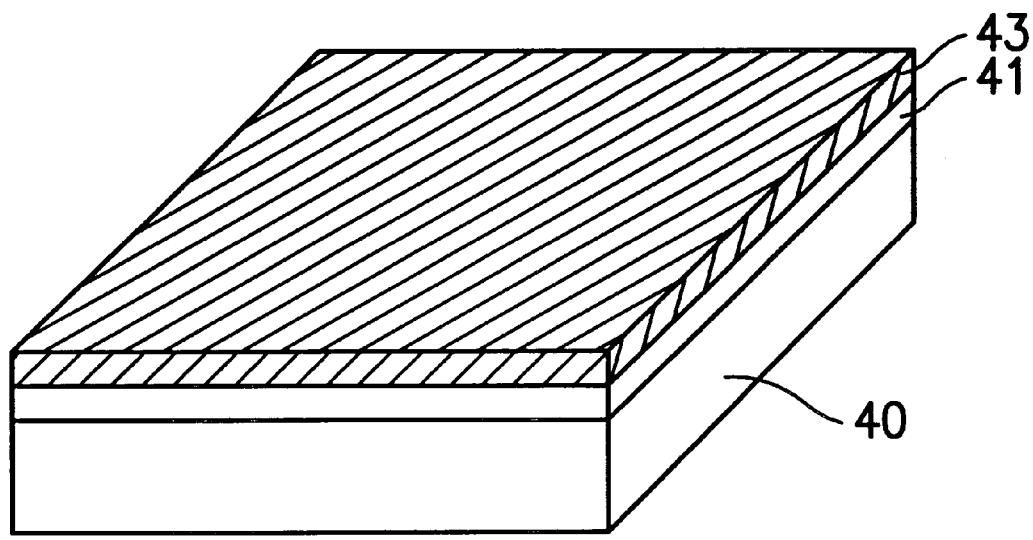

Referring next to FIG. 4B, in the subsequent step, a conductive layer 43, such as a layer of a conductive material selected from the group consisting of polysilicon, tungsten, titanium, and aluminum, is formed by physical vapor deposition (PVD) or chemical-vapor deposition (CVD) over the first insulating layer 41.

Figure 4C:
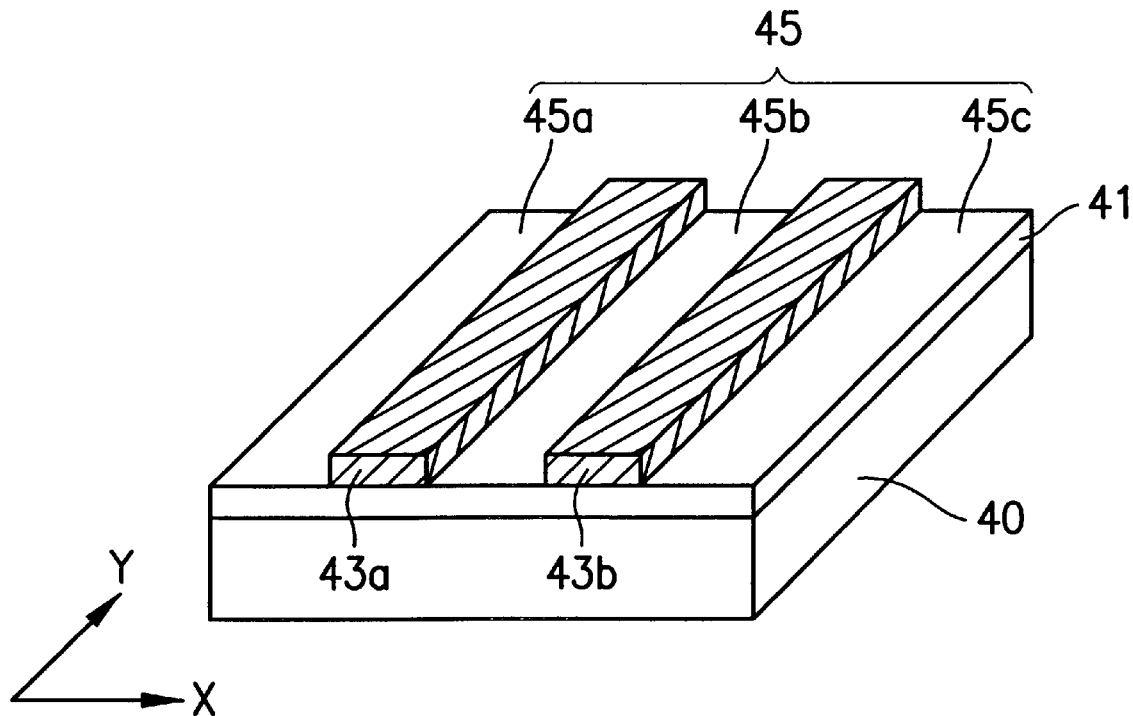

Referring further to FIG. 4C, in the subsequent step, a photolithographic and etching process is performed on the wafer so as to remove selected portions of the conductive layer 43. The remaining portions of the conductive layer 43 serve as a plurality of substantially parallel-spaced word lines 43a, 43b oriented in a first direction as indicated by the Y-axis; and the empty spaces left by the removed portions of the same form a plurality of trenches 45a, 45b, 45c (which are hereinafter collectively designated by the reference numeral 45).

Figure 4D:
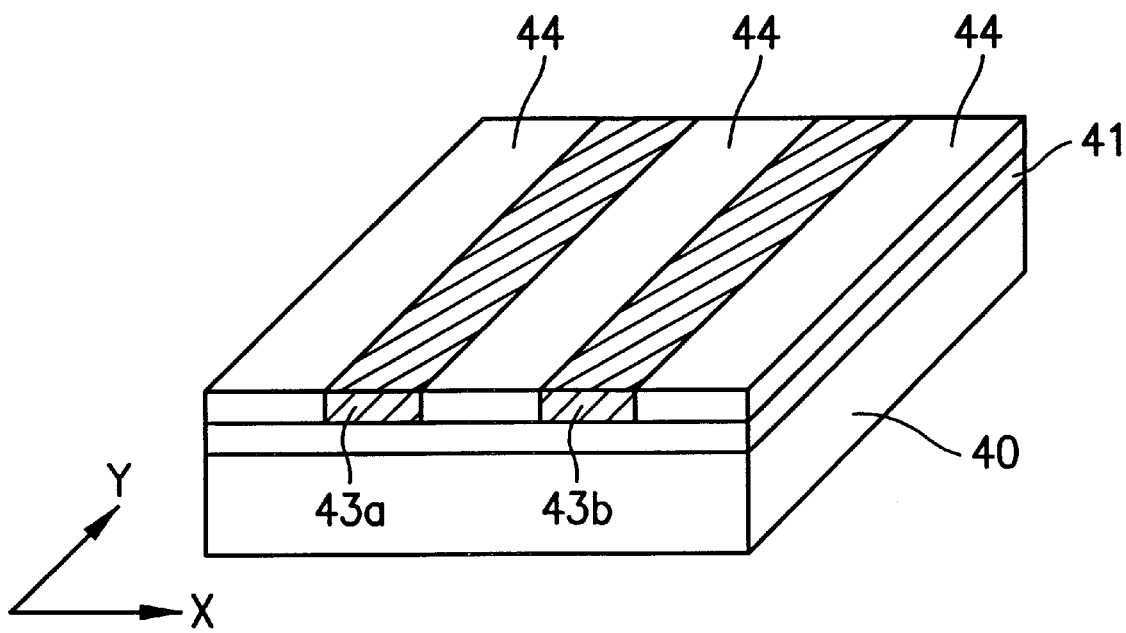

Referring to FIG. 4D, a second insulating layer 44, such as a layer of silicon oxide, is formed to fill up the trenches 45 (FIG. 4C) with a top surface substantially level with the top surface of the conductive layers (word lines) 43a, 43b. To provide a flat top surface for the second insulating layer 44, a planarization process, such as a spin-on glass (SOG) or a chemical mechanical polish (CMP) process, is performed. In the SOG process, an oxide layer is first deposited in the trenches 45 and then etched back until the top surface thereof is substantially level with the conductive layers (word lines) 43a, 43b.

Figure 4E:
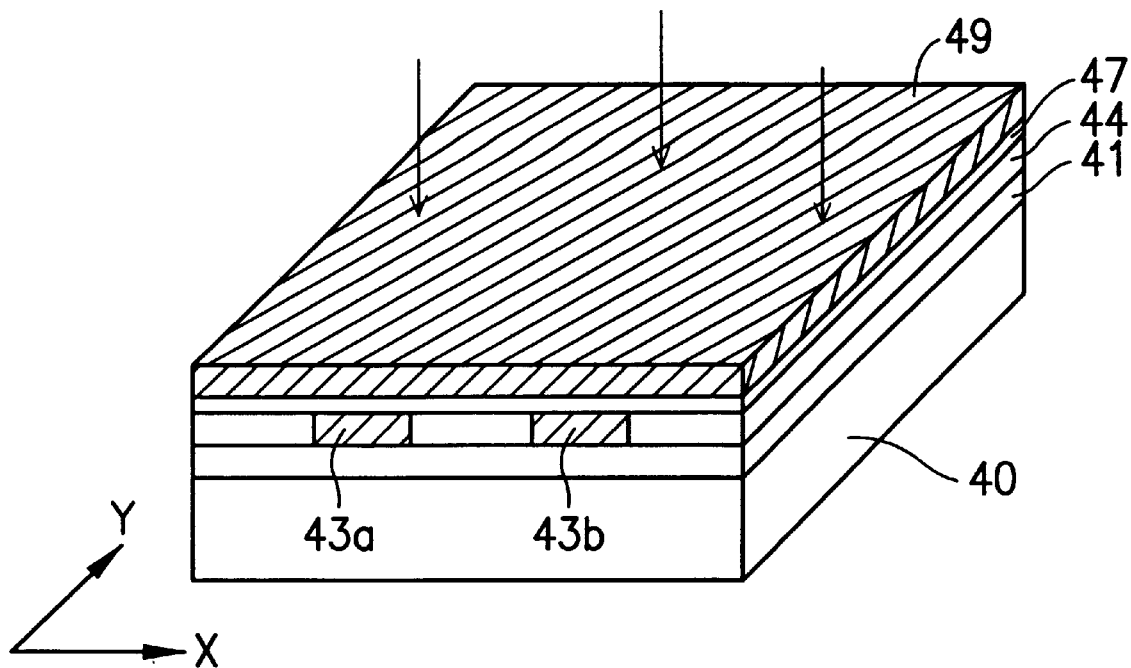

Referring further to FIG. 4E, a third insulating layer 47, such as a layer of silicon oxide or a layer of the ONO (silicon dioxide/silicon nitride/silicon dioxide) structure, is formed over the entire top surface of the wafer. Next, a semiconductor layer 49, such as a layer of intrinsic amorphous silicon or polysilicon, is formed over the third insulating layer 47. The semiconductor layer 49 can be either P-type or N-type. One method for forming the semiconductor layer 49 is to first conduct a PECVD (plasma enhanced chemical-vapor deposition) process on the wafer by using the vapor of $SiH_4$ at a temperature of about 350° C. to 575° C. to deposit a layer of intrinsic amorphous silicon, and then conduct an ion implantation process on the wafer so as to diffuse an impurity material, such as boron, into the intrinsic amorphous silicon layer to adjust the concentration thereof to a higher level and thereby increase the conductivity thereof.

Figure 4F:
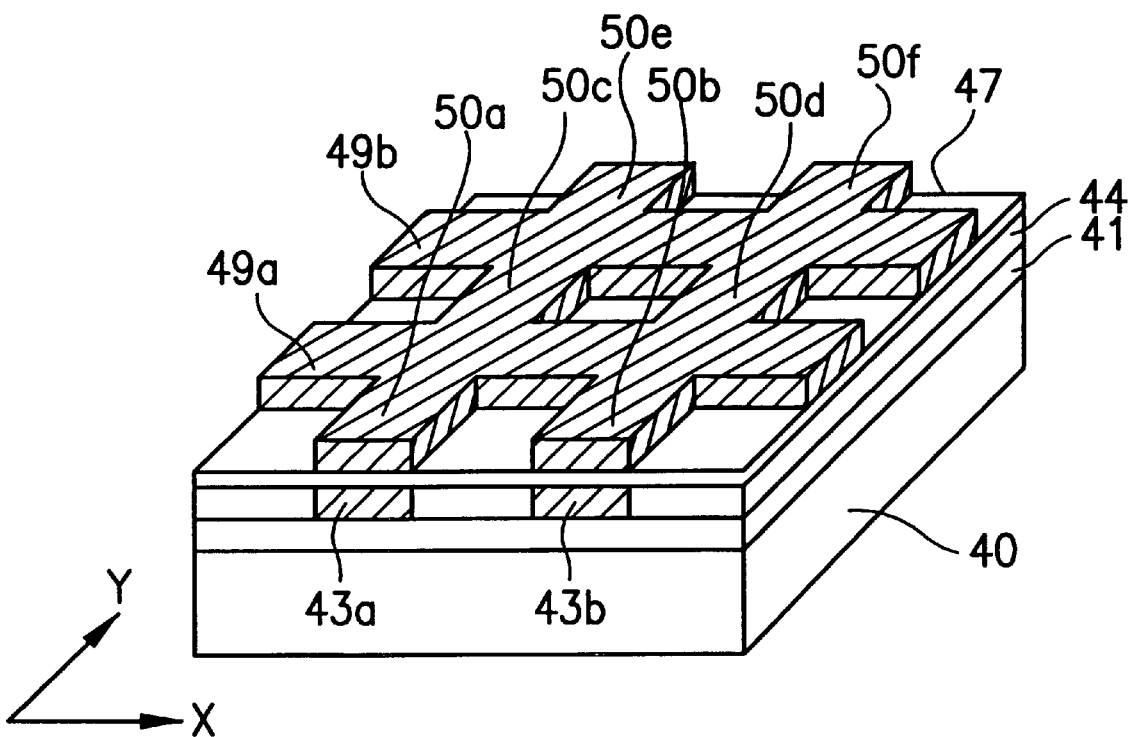

Referring next to FIG. 4F, the subsequent step is to remove selected portions of the semiconductor layer 49 along with the underlying portions of the third insulating layer 47 by a photolithographic and etching process so as to form a grid-like structure having a plurality of parallel-spaced first portions 49a, 49b oriented in the second direction as indicated by the X-axis, and a plurality of parallel-spaced second portions 50a, 50b, 50c, 50d, 50e, 50f oriented in the first direction as indicated by the Y-axis. The remaining portions of the third insulating layer 47 are designated by the reference numerals 47a, 47b in FIG. 4F.

Figure 4G:
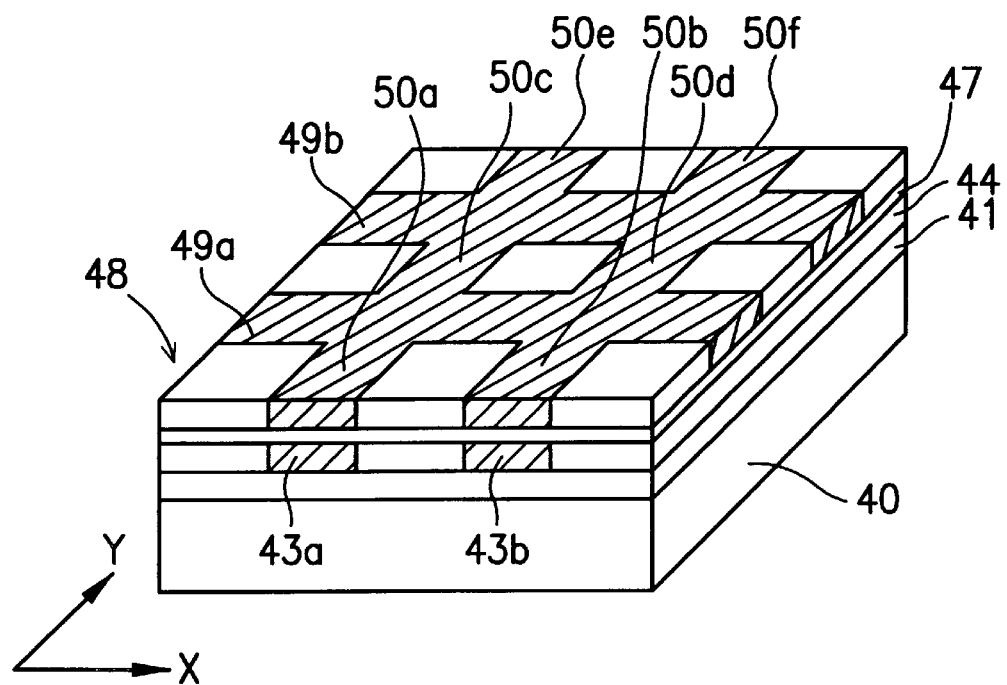

Referring next to FIG. 4G, in the subsequent step, a fourth insulating layer 48 is formed to fill up each of the empty spaces in the grid-like structure. To provide a flat top surface for the fourth insulating layer 48, a planarization process, such as a spin-on glass (SOG) or a chemical mechanical polish (CMP) process, is performed. Through the planarization process, the top surface of the fourth insulating layer 48 is flattened to substantially level the top surface of the grid-like structure.

Figure 4H:
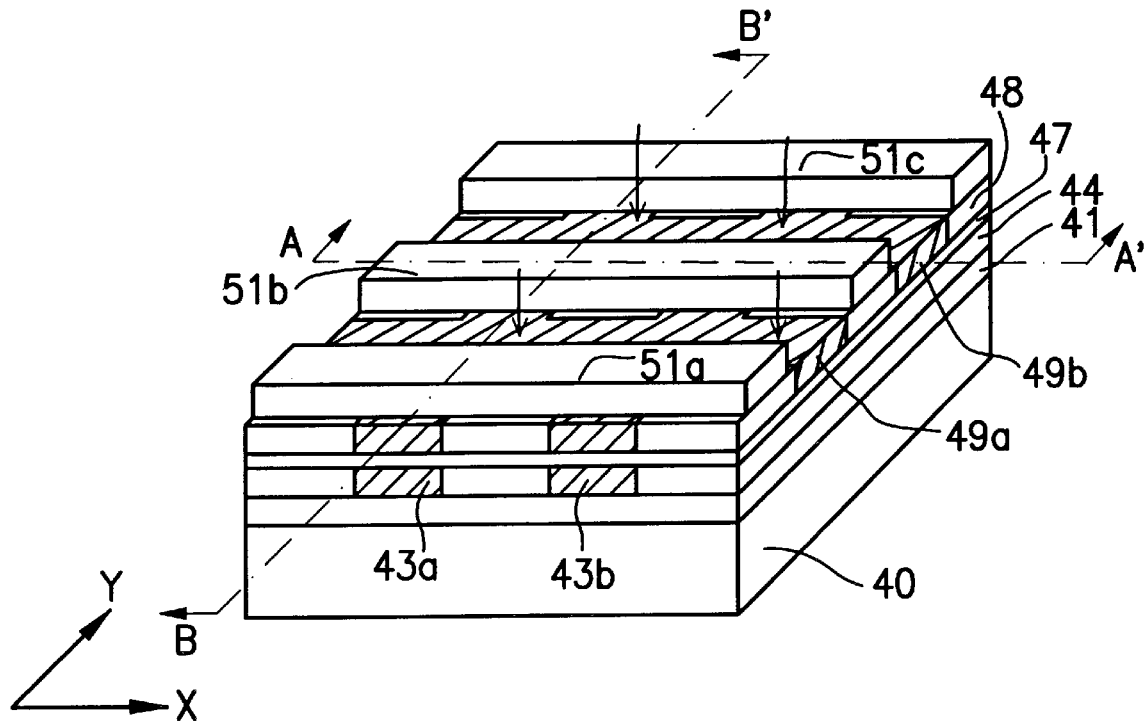

Referring further to FIG. 4H, the subsequent step is to define the first portions 49a, 49b of the grid-like structure that are oriented in the X-direction as bit lines, and the second portions 50a, 50b, 50c, 50d, 50e, 50f of the same as channel regions. First, a photoresist layer is coated over the entire top surface of the wafer and then selectively removed to expose the first portions 49a, 49b of the grid-like structure that are oriented in the X-direction. The remaining portions 51a, 51b, 51c of the photoresist layer are elongated strips that cover all of the second portions 50a, 50b, 50c, 50d, 50e, 50f of the grid-like structure and all of the fourth insulating layers 48 therebetween. Next, an ion implantation process is performed on the wafer so as to diffuse an impurity material of the first type, such as N-type arsenic (As) ions, into the exposed portions of the grid-like structure (i.e., the first portions 49a, 49b of the grid-like structure oriented in the X-direction) to convert the same into $N^+$ diffusion regions with increased conductivity to serve as a plurality of bit lines for the ROM device. After this, the photoresist layers 51a, 51b, 51c are removed.

The foregoing steps complete the fabrication of a semi-finished product of the ROM device which is not yet mask programmed to store permanent data. After receiving orders from the customer, a mask programming process is performed on the semi-finished product of the ROM device so as to store the customer-supplied binary code permanently in the ROM device. This process will be described in full detail in the following with reference to the ensuing FIGS. 4I, and 4J.

Figure 4I:
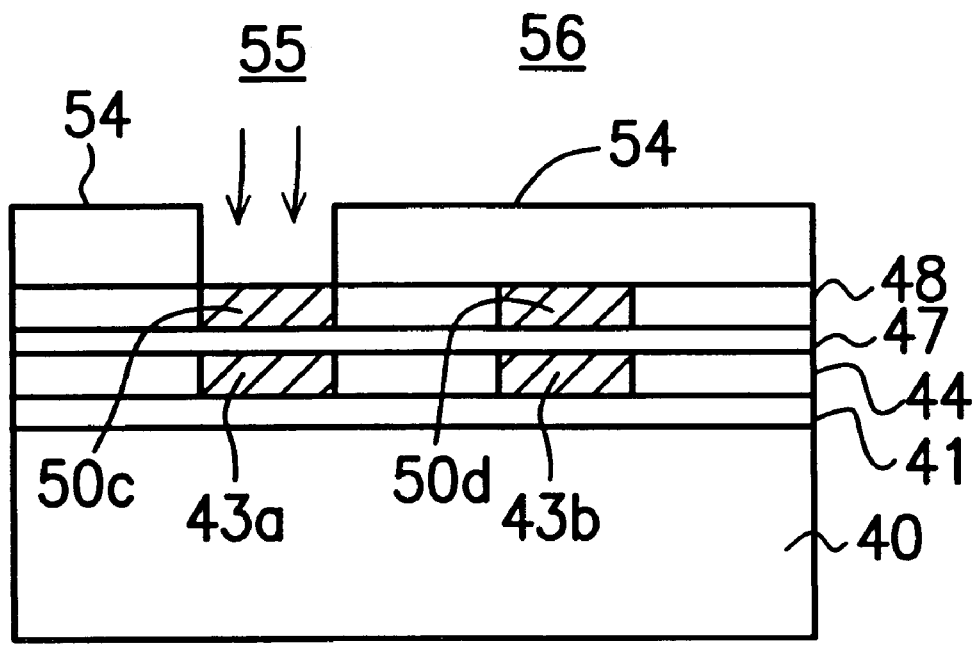
Figure 4J:
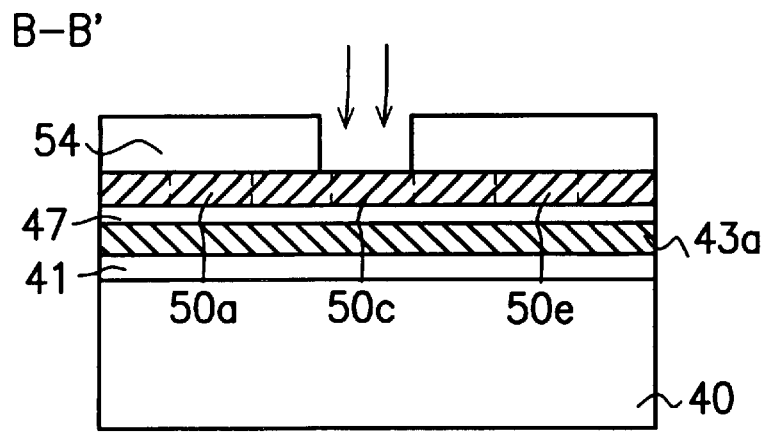

Referring together to FIGS. 4I and 4J (in which FIG. 4I shows a sectional diagram of the wafer of FIG. 4H cutting through the line A–A', while FIG. 4J shows another sectional diagram of the same cutting through the line B–B'), the subsequent step is to conduct the so-called code-definition and implantation process on the wafer to set different threshold voltage levels to the selected MOSFET memory cells in the ROM device. The different threshold voltage levels represent different values of binary data that are permanently written into the associated MOSFET memory cells of the ROM device.

First, a photoresist layer 54 is formed over the wafer and then selectively removed to expose those channel regions that are associated with those MOSFET memory cells that are to be set to a permanently-OFF state. The unexposed channel regions are, on the other hand, associated with those MOSFET memory cells that are to be set to a permanently-ON state.

In the case of FIG. 4I, for example, the photoresist layer 54 has one opening which exposes the channel region 50c which is associated with a first MOSFET memory cell 55 that is to be set to a permanently-OFF state while covering the channel region 50d which is associated with a second MOSFET memory cell 56 that is to be set to a permanently-ON state. An ion implantation process is then performed on the wafer so as to diffuse an impurity material, into the exposed channel region 50c. As a result of this, the MOSFET memory cell 55 associated with the channel region 50c will be set to have a low threshold voltage, indicating a permanently-OFF state; while the MOSFET memory cell 56 associated with the channel region 50d will be set to have a high threshold voltage, indicating a permanently-ON state. This completes the programming and permanent storage of the customer-supplied binary code in the ROM device.

After this, conventional steps, including the forming of contacts, metallurgy, passivation, and packaging, are carried out to finish the product of the ROM device. These steps are standard processes in the manufacturing process, so that description thereof will not be further detailed.

Figure 4K:
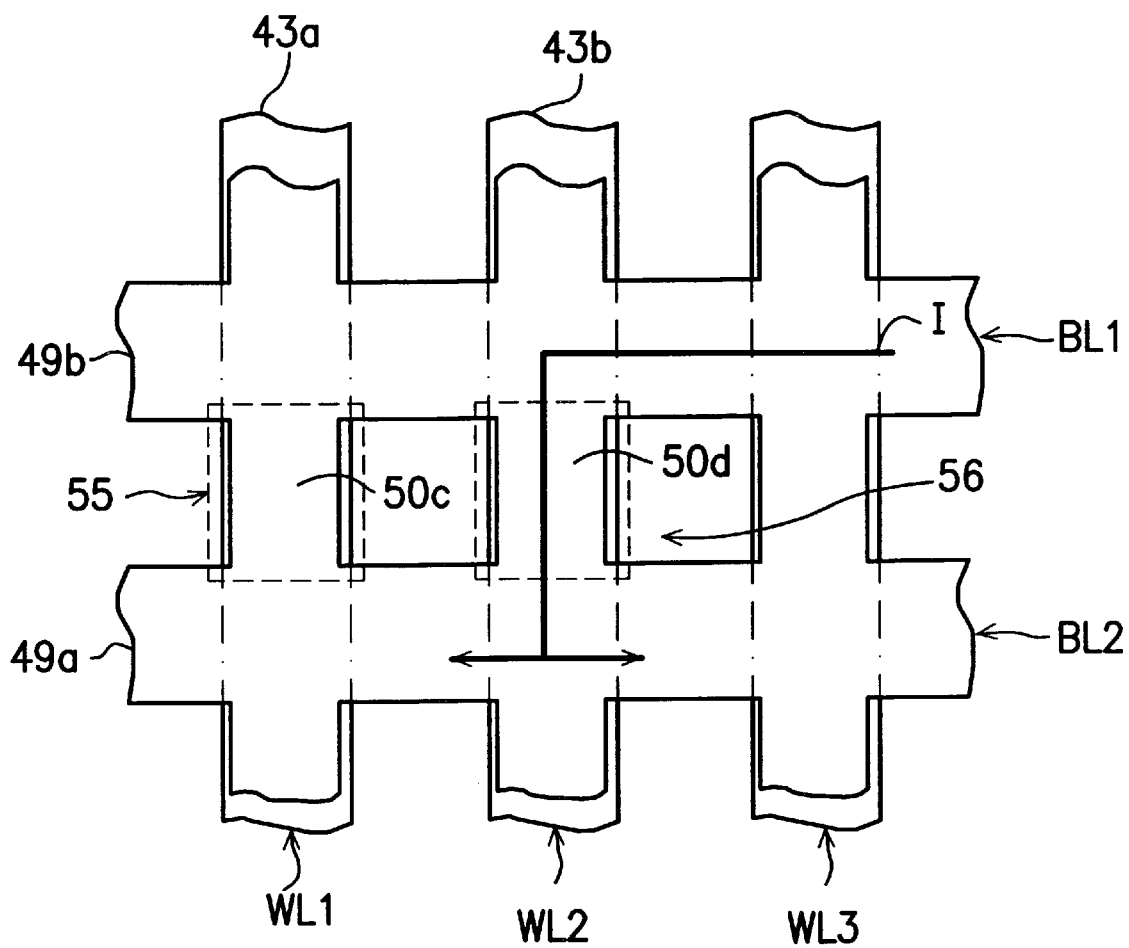

Referring further to FIG. 4K, there is shown a schematic top view of the finished product of the ROM device. As shown, this ROM device includes a plurality of parallel-spaced bit lines BL1, BL2 (the first portions 49a, 49b of the grid-like structure) and a plurality of parallel-spaced overlaying word lines WL1, WL2, WL3 (the conductive layers 43a, 43b) intercrossing the bit lines BL1, BL2 substantially at a right angle. The channel region 50c, which is diffused with impurities through the foregoing ion implantation, causes the associated MOSFET memory cell, which is indicated by the dashed box labeled with the reference numeral 55, to be set to a permanently-OFF state; whereas the channel 50d, which is not diffused with impurities, causes the associated MOSFET memory cell, which is indicated by the dashed box labeled with the reference numeral 56, to be set to a permanently-ON state. As a result of this, when a potential is applied to the word line WL2, the channel region 50d will be set to an ON-state, thus allowing the current to flow from the bit line BL1 to the bit line BL2.

In conclusion, the prevent invention offers some benefits over the prior art. First, since an SOG process or a CMP process is utilized instead of the thermal oxidation process in the prior art to form the second insulating layer 44, better planarization of the wafer surface can be achieved. In addition, since in the SOG process, a dielectric material such as silicon oxide is used in the form of liquid to cover the top surface of the wafer, the gap fill capability for grooves in the top surface of the wafer is better than using the CVD method as in the prior art. Voids in the top surface of the wafer are thus substantially reduced.

Second, since the bit lines are not formed by diffusing impurities into the silicon substrate, the drawbacks of lateral diffusion, junction leakage, and reduced breakdown voltage are not experienced when the ROM device is further miniaturized.

The access operation to read data from the ROM device is performed by applying an electric potential to the word lines and then using sense amplifiers to detect the change in current in the bit lines. This operation is the same as the conventional access method so that description thereof will not be further detailed.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a ROM device, comprising the steps of:

(1) forming a semiconductor substrate having a first insulating layer thereon;

(2) forming a plurality of substantially parallel-spaced elongated conductive layers oriented in a first direction on the first insulating layer, the conductive layers serving as a plurality of word lines;

(3) forming a second insulating layer in each of the empty spaces between the plurality of conductive layers;

(4) forming a third insulating layer over the conductive layers and the insulating layer;

(5) forming a semiconductor layer over the third insulating layer;

(6) removing selected portions of the semiconductor layer to form a grid-like structure of the semiconductor layer having a plurality of substantially parallel-spaced first portions oriented in a second direction substantially at a right angle with respect to the first direction and a plurality of substantially parallel-spaced second portions oriented in the first direction overlaying the conductive layers;

(7) forming a fourth insulating layer to fill up each of the empty spaces in the grid-like structure;

(8) defining the first portions of the grid-like structure as bit lines and the second portions of the grid-like structure as channel regions; and (9) performing a code-definition and implantation process to program data into the ROM device, wherein
a first selected group of the channel regions are doped with an impurity material to thereby have a first threshold voltage representing the storage of a first binary digit into the associated memory cells, and
a second selected group of the channel regions are not doped with the impurity material to thereby have a second threshold voltage representing the storage of a second binary digit into the associated memory cells.

2. The method of claim 1, wherein in said step (3), the second insulating layer is formed by a planarization process.

3. The method of claim 1, wherein in said step (5), the semiconductor layer is doped with an impurity material so as to increase the conductivity thereof.

4. The method of claim 1, wherein in said step (7), the fourth insulating layer is formed by an SOG process.

5. The method of claim 1, wherein in said step (7), the fourth insulating layer is planarized by a CMP process.

6. The method of claim 1, wherein said step (8) includes the substeps of:

(i) coating a photoresist layer over the grid-like structure;

(ii) removing selected portions of the photoresist layer to expose the first portions of the grid-like structure with the remaining portions of the photoresist layer covering the second portions of the grid-like structure and the fourth insulating layers therebetween;

(iii) performing an ion implantation process so as to diffuse an impurity material into the exposed portions of the grid-like structure which are the first portions of the grid-like structure to convert the first portions of the semiconductor layer into a plurality of diffusion regions with increased conductivity to serve as the bit lines; and (iv) removing the photoresist layer.

7. The method of claim 1, wherein said step (9) includes the substeps of:
(i) forming a photoresist layer over the grid-like structure and the fourth insulating layer;
(ii) removing selected portions of the photoresist layer to expose those channel regions that are associated with a first selected group of the MOSFET memory cells that are to be set to a permanently-OFF state with the unexposed channel regions associated with a second selected group of the MOSFET memory cells that are to be set to a permanently-ON state;
(iii) performing an ion implantation process so as to diffuse an impurity material into the exposed channel regions; and
(iv) removing the photoresist layer.

8. A method for fabricating a ROM device, comprising the steps of:
(1) forming a semiconductor substrate having a first insulating layer thereon;
(2) forming a plurality of substantially parallel-spaced elongated conductive layers oriented in a first direction on the first insulating layer, the conductive layers serving as a plurality of word lines;
(3) forming a second insulating layer formed in each of the empty spaces between the plurality of conductive layers;
(4) forming a third insulating layer formed over the conductive layers and the insulating layer;
(5) forming a semiconductor layer over the third insulating layer;
(6) performing a photolithographic and etching process so as to remove selected portions of the semiconductor layer to form a grid-like structure of the semiconductor layer having a plurality of substantially parallel-spaced first portions oriented in a second direction substantially at a right angle with respect to the first direction and a plurality of substantially parallel-spaced second portions oriented in the first direction overlaying the conductive layers;
(7) forming a fourth insulating layer to fill up each of the empty spaces in the grid-like structure;
(8) defining the first portions of the grid-like structure as bit lines and the second portions of the grid-like structure as channel regions, which includes the substeps of:

(i) forming a photoresist layer over the grid-like structure and the fourth insulating layer;
(ii) removing selected portions of the photoresist layer to expose those channel regions that are associated with a first selected group of the MOSFET memory cells that are to be set to a permanently-OFF state with the unexposed channel regions associated with a second selected group of the MOSFET memory cells that are to be set to a permanently-ON state;
(iii) performing an ion implantation process so as to diffuse an impurity material into the exposed channel regions; and
(iv) removing the photoresist layer;
(9) performing a code-definition and implantation process to program data into the ROM device.

9. The method of claim 8, wherein in said step (5), the semiconductor layer is a layer of intrinsic amorphous silicon deposited over the third insulating layer.

10. The method of claim 8, wherein in said step (5), the semiconductor layer is P-type.

11. The method of claim 8, wherein in said step (5), the semiconductor layer is N-type.

12. The method of claim 8, wherein said step (9) includes the substeps of:
(i) coating a photoresist layer over the grid-like structure;
(ii) removing selected portions of the photoresist layer to expose a selected group of the channel regions associated with a first selected group of MOSFET memory cells that are to be set to a permanently-OFF state with the unexposed channel regions associated with a second selected group of MOSFET memory cells that are to be set to a permanently-ON state.

13. The method of claim 11, wherein said step (9) further includes the substep of:
performing an ion implantation process so as to diffuse an impurity material into the exposed channel regions such that
the first selected group of the channel regions are doped with the impurity material to thereby have a first threshold voltage representing the storage of a first binary digit into the associated memory cells, and
a second selected group of the channel regions are not doped with the impurity material to thereby have a second threshold voltage representing the storage of a second binary digit into the associated memory cells.

14. The method of claim 13, wherein in said step (9), the impurity material is P-type.

15. The method of claim 13, wherein in said step (9), the impurity material is N-type.

* * * * *